(12) United States Patent
Isono

(10) Patent No.: US 7,202,700 B2
(45) Date of Patent: Apr. 10, 2007

(54) SEMICONDUCTOR DEVICE WHICH EXHIBITS HIGH-SPEED PERFORMANCE AND LOW POWER CONSUMPTION

(75) Inventor: Takanori Isono, Joyo (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 239 days.

(21) Appl. No.: 11/007,227

(22) Filed: Dec. 9, 2004

(65) Prior Publication Data

US 2005/0127941 A1 Jun. 16, 2005

(30) Foreign Application Priority Data

Dec. 12, 2003 (JP) ............................. 2003-414839

(51) Int. Cl.
*H03K 19/0175* (2006.01)
*H03K 19/094* (2006.01)
*H03K 19/096* (2006.01)

(52) U.S. Cl. ........................ 326/81; 326/83; 326/95; 326/98; 326/121

(58) Field of Classification Search ................ 326/81, 326/83, 95
See application file for complete search history.

(56) References Cited

U.S. PATENT DOCUMENTS 5,594,371 A * 1/1997 Douseki .................. 326/119
6,049,245 A * 4/2000 Son et al. ................. 327/544
6,091,656 A * 7/2000 Ooishi ..................... 365/226
6,236,613 B1 * 5/2001 Ooishi ..................... 365/226
6,307,234 B1 * 10/2001 Ito et al. ................... 257/371
6,384,674 B2 * 5/2002 Tanizaki et al. ........... 327/544
6,529,042 B1 * 3/2003 Hiramoto et al. ........... 326/83
6,556,071 B2 * 4/2003 Notani et al. .............. 327/544
6,617,916 B1   9/2003 Kurotsu
6,635,934 B2 * 10/2003 Hidaka ..................... 257/369
6,759,873 B2 * 7/2004 Kang et al. ................. 326/81

FOREIGN PATENT DOCUMENTS

JP           9269854           10/1997

* cited by examiner

*Primary Examiner*—Rexford Barnie
*Assistant Examiner*—Dylan White
(74) *Attorney, Agent, or Firm*—Stevens, Davis, Miller & Moser, LLP

(57) ABSTRACT

A semiconductor device includes a cell source line which supplies a voltage to logic circuits, a capacity source line which supplies a voltage to the cell source line, a control circuit source line, switches by which the cell source line is isolated from or connected to the capacity source line and the control circuit source line, and buffer circuits which drive signals which control the switches, respectively. When the system is activated, a potential is applied to the capacity source line for charging, after which the cell-to-capacity switch is turned on. Then, a voltage is applied to the cell source line, which allows a steep rise in voltage at the cell source line. As a result, charging time is reduced and flow-through current which flows through transistors constituting the logic circuit can be reduced as well.

8 Claims, 5 Drawing Sheets

SEMICONDUCTOR DEVICE WHICH EXHIBITS HIGH-SPEED PERFORMANCE AND LOW POWER CONSUMPTION

This application claims priority under 35 U.S.C. 119 based on Japanese Application No. 2003-414839 filed Dec. 12, 2003.

BACKGROUND OF THE INVENTION

1. Field of the Invention

The present invention relates to a semiconductor device which is used for mobile equipment, such as cellular phones, and so on, and which is intended to exhibit low power consumption through a power cutoff technique.

2. Description of the Related Art

In recent years, power consumption during standby of mobile equipment, such as cellular phones, etc., has become a problem. Thus, in order to reduce the power consumption during standby, a technique is used which interrupts voltage supply (cuts off power supply) to semiconductor devices to reduce off-leakage current at transistors. By recent finer design rules in semiconductor process, the threshold value of transistors is also decreased to induce more off-leakage at transistors, which makes power cutoff technique very useful. The power cutoff technique of reducing off-leakage current to implement low power consumption is in the actual use (see, for example, Japanese Patent Laid-Open No. 269854/1997). In conventional power cutoff, leakage current can be completely suppressed by externally stopping voltage application to source lines. In recent years, however, a voltage to drive transistors is lowered due to the resistive components during circuit operation, which degrades circuit performance. In order to suppress the circuit performance degradation, a technique is adopted which prevent a voltage drop by giving much parasitic capacity to power supply.

As described above, however, in the technique of giving much parasitic capacity to power supply in order to suppress the circuit performance degradation, the power supply capacity requires much charging time at the time of system recovery after power cutoff and it takes much time to perform the rise of a system. Also, due to the long charging time to meet the power supply capacity, the rise of power supply to drive transistors varies by transistor. As a result, flow-through current, which flows through the transistors, arises to consume electric power.

SUMMARY OF THE INVENTION

It is an object of the invention to provide a semiconductor device capable of exhibiting high-speed performance and low power consumption by making a steep rise in voltage at power-on after power cutoff while reducing off-leakage current, and by reducing flow-through current which flows at that time.

The semiconductor device according to the invention comprises logic circuits, a first source line which supplies voltage to the logic circuit, a second source line which supplies voltage to the first source line, a third source line, first switches which isolate or connect the first and second source lines, second switches which isolate or connect the first and third source lines, first control circuits which receive voltage from the third source line and drive a first signal to control the first switch, and second control circuits which receive voltage from the third source line and drive a second signal to control the second switch.

According to the invention, after power is cut off, it is possible to prevent flow-through current during the rise of power supply for system reactivation, achieve a steep rise in power supply, and substantially reduce the time of reclosing, which reduces power consumption, achieves a high-speed circuit, and allows a realtime system.

Also, the semiconductor device according to the invention comprises a plurality of cells arranged. Some of the cells, which form a logic circuit inside, form the first source line through the use of an intracell source line. The others are the cells which form the first control circuit inside and the cells which form the second control circuit inside, each of which is provided with not only an intracell source line connected to the third source line but the second switch at not less than one end of the intracell source line.

Further, the semiconductor device according to the invention provides a normal operation mode and a low power consumption mode. In order to create the normal operation mode, voltage is supplied to the second source line and the third source line, the first source line is connected to the second source line by the first switch, and the first source line is connected to the third source line by the second switch. In order to create the low power consumption mode, the first source line is isolated from the second source line by the first switch, and the first source line is isolated from the third source line by the second switch. When the normal operation mode is changed to the low power consumption mode, the first source line is isolated from the second source line by the first switch and the first source line is isolated from the third source line by the second switch, after which the voltage supply to the second source line is stopped. When the low power consumption mode is changed to the normal operation mode, voltage supply to the second source line is commenced. After the second source line has been charged, the second source line is connected to the first source line by the first switch. After the first source line has been charged, the first source line is connected to the third source line by the second switch.

The configuration above makes it possible to provide a steep rise in voltage at the cell source line (the first source line) during its reactivation after power cutoff (switch from the low power consumption mode to the normal operation mode) by supplying voltage to the capacity source line (the second source line) prior to the activation of the system, which speeds up the rise of the system and substantially reduces flow-through current derived from transistors which make up the logic circuit during the rise of the cell source line. In addition, by stopping the rise of the cell source line until immediately before the activation of the system (that is, stopping the voltage supply to the cell source line for hours), off-leakage current can be reduced.

Furthermore, the semiconductor device according to the present invention provides a minimum power consumption mode wherein the voltage supply to the second and third source lines is stopped. In case where the normal operation mode is changed to the minimum power consumption mode, the voltage supply to the second and third source lines is stopped. In case where the minimum power consumption mode is switched to the normal operation mode, the voltage supply to the third source line is commenced, the first source line is isolated from the second source line by the first switch, and, at the same time, the first source line is isolated from the third source line by the second switch. As a result, the switch to the low power consumption mode is made, after which the switch from the low power consumption mode to the normal operation mode is made.

This minimum power consumption mode is effective at achieving lower power consumption when the system is stopped for hours.

Furthermore, the semiconductor device according to the invention is provided with signal logic retaining circuits which receive power supply voltage from the third source line and retain the states of signals.

DESCRIPTION OF THE PREFERRED EMBODIMENTS

The semiconductor device of the present invention will now be described below with reference to the drawings.

Figure 1:
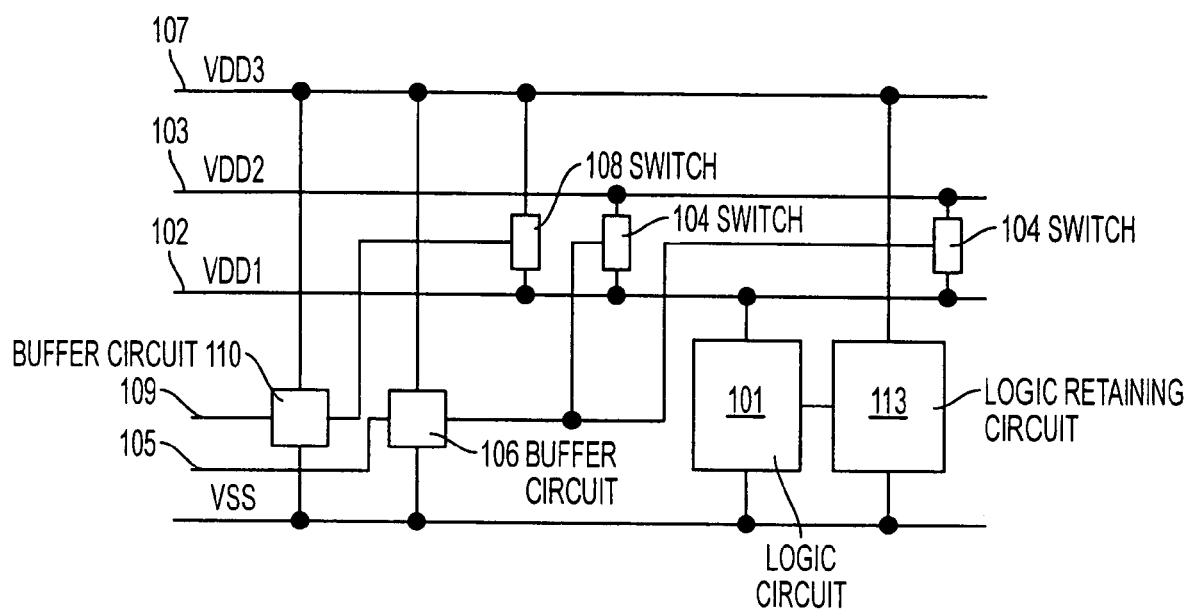
FIG. 1 is a block diagram of a semiconductor device disclosed in an embodiment of the present invention.

FIG. 1 is the block diagram of a semiconductor device according to an embodiment of the present invention, which includes a logic circuit 101, a cell source line 102 which supplies a circuit power supply voltage to the logic circuit 101 in conjunction with a ground line (VSS), a capacity source line 103 which is able to supply a voltage to the cell source line 102, and a cell-to-capacity switch 104 which is able to isolate or connect the cell source line 102 and the capacity source line 103. A buffer circuit 106, which drives a signal 105 controlling the cell-to-capacity switch 104, is driven by a voltage from a control circuit source line 107. Further, there is provided a cell-to-control switch 108 which isolates the control circuit source line 107 and the cell source line 102. A buffer circuit 110, which drives a signal 109 controlling the cell-to-control switch 108, is driven by a voltage from the control circuit source line 107.

Figure 2:
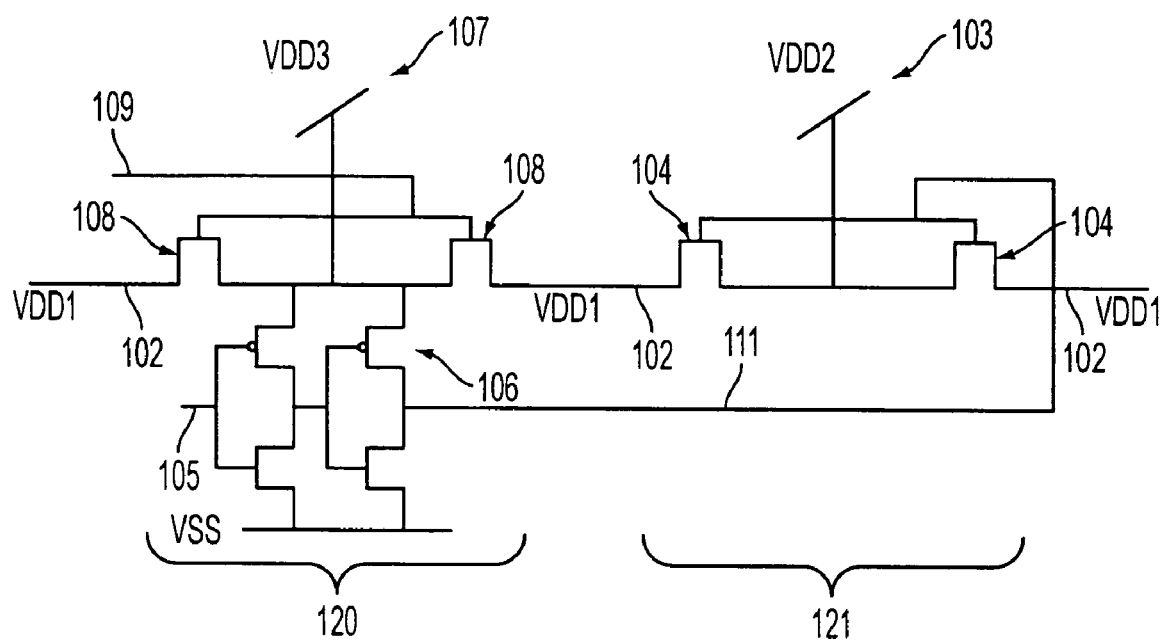
FIG. 2 illustrates a transistor configuration of a key portion 1 disclosed in an embodiment of the present invention.

FIG. 2 shows a transistor circuit comprised of components of a circuit group which controls the cell-to-capacity switch 104. In FIG. 2, the cell-to-capacity switch 104 and the cell-to-control switch 108 are comprised of a P-channel transistor respectively, and the buffer circuit 106 is comprised of two inverters connected with each other, the inverter comprising a P-channel transistor and an N-channel transistor. Incidentally, FIG. 2 shows the transistors simply.

The cell-to-capacity switch 104 is driven by the buffer circuit 106, the buffer circuit 106 is driven by the control circuit source line 107, and the cell-to-control switch 108 is positioned at both ends of the control circuit source line 107. A circuit group 120 is comprised of the signal 105, the buffer circuit 106, the cell-to-control switch 108, the control circuit source line 107, and the signal 109. A circuit group 121 is comprised of the cell-to-capacity switch 104, capacity source line 103, a signal 111 output from the circuit group 120. The circuit group 121 exists in plural form to the extent that sufficient voltage can be supplied to the cell source line 102, and the circuit group 120 exists in plural form to the extent that signal waveforms can be maintained to the extent that the propagation delay of the signal 105 is not too much.

Figure 3:
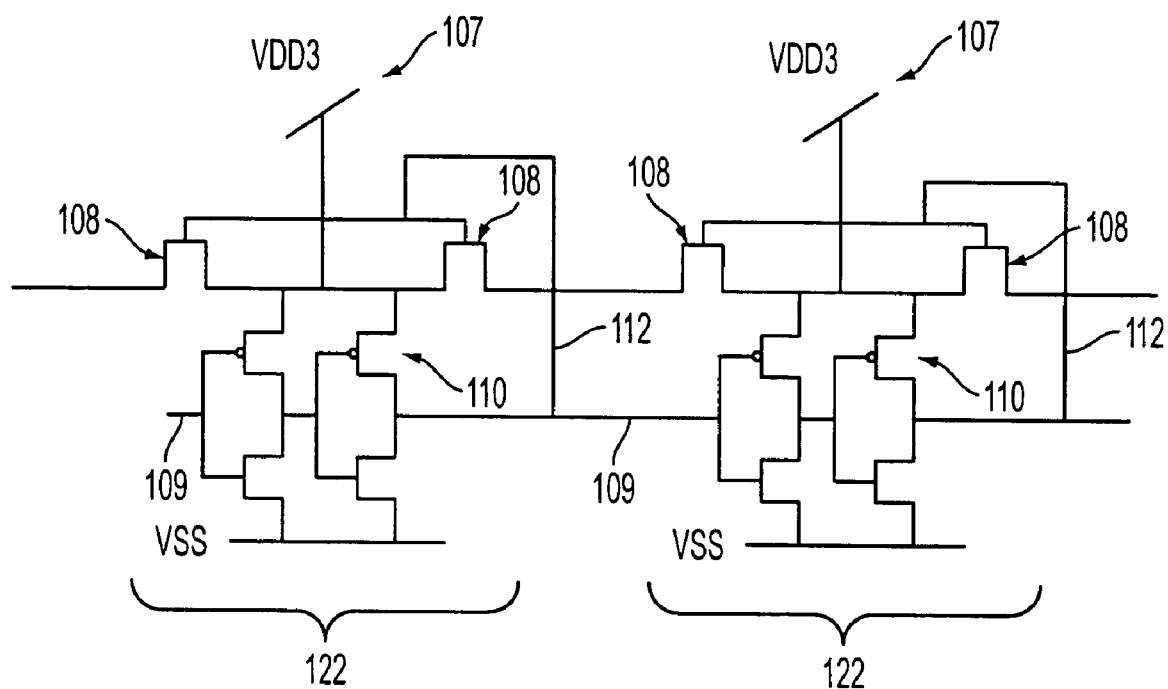
FIG. 3 illustrates a transistor configuration of a key portion 2 disclosed in an embodiment of the present invention.

FIG. 3 shows a transistor circuit comprised of components of circuit groups which control cell-to-control switches 108. In FIG. 3, the cell-to-control switch 108 is composed of a P-channel transistor as in FIG. 2, and buffer circuits 110 are each comprised of two inverters connected with each other as in the case of the buffer circuit 106 in FIG. 2, the inverter comprising a P-channel transistor and an N-channel transistor. Incidentally, the transistors are also given simply in FIG. 3.

Circuit groups 122 have the buffer circuit 110 which drives a signal 109 controlling the cell-to-control switches 108, and each cell-to-control switch 108 is positioned at both ends of the control circuit source line 107. The cell-to-control switch 108 is controlled by signals 112 output from the buffer circuit 110. The signals 112 output from a circuit group 122 becomes signals 109 for the next-stage circuit group 122, and these circuit groups 122 were connected together to make up an isolation circuit for the cell source line 102 and the control circuit source line 107. Also, the signal 112 functions as the signal 109 which controls the cell-to-control switches 108 included in the circuit group 120 in FIG. 2. The circuit group 122 exists in plural form to the extent that signal waveforms can be maintained to the extent that the propagation delay of the signal 109 is not too much.

Figure 4:
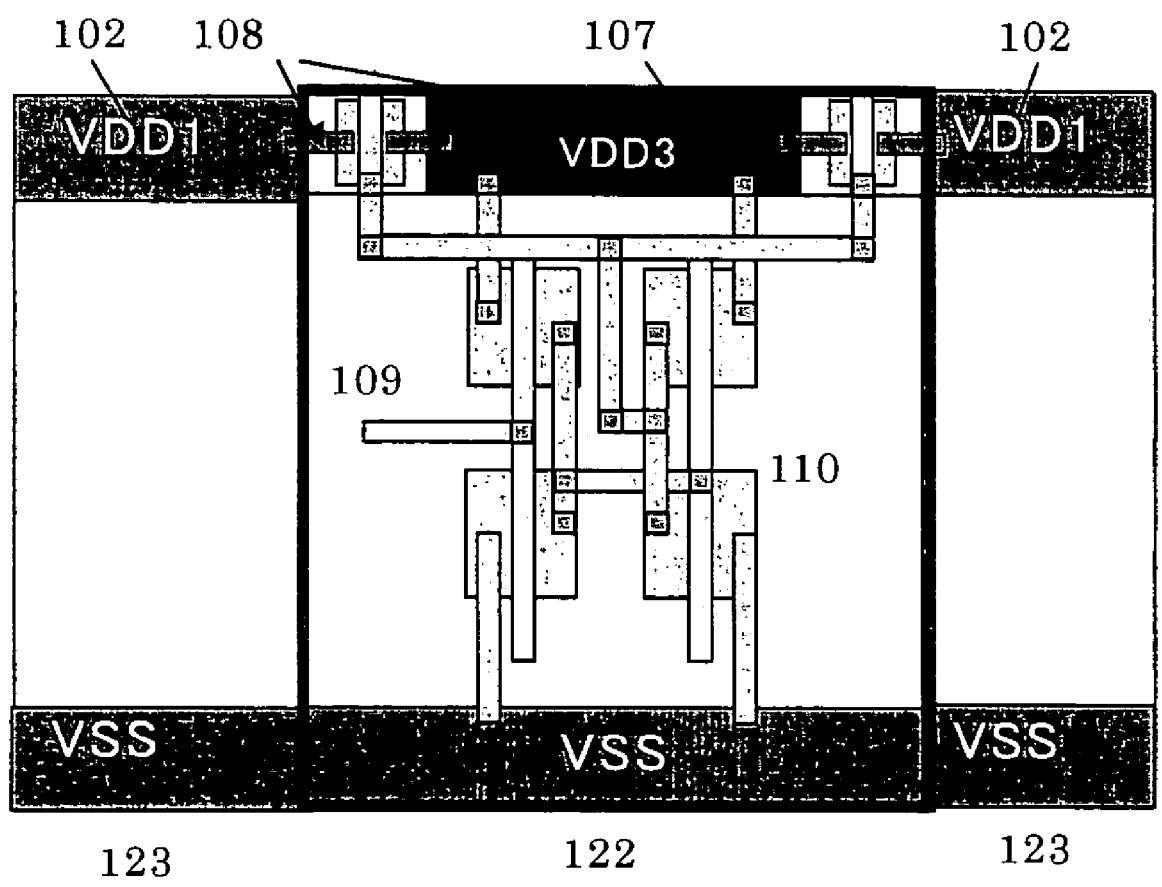
FIG. 4 illustrates a layout of the key portion 2 disclosed in an embodiment of the present invention.

FIG. 4 shows the layout of the circuit group 122 in FIG. 3. In a cell which makes up the circuit group 122, an intracell source line being opposed to the ground line (VSS) in a standard cell represents the control circuit source line 107, and the cell-to-control switches 108 are located at both ends of the control circuit source line 107. Circuit groups 123 represent standard cells which made up normal logic. In case where two circuit groups 122 are arranged as shown in FIG. 3, two cells, which made up a circuit group 122 respectively, are arranged. In the case above, the two cells may be arranged in such a manner that their intracell source lines (control circuit source lines 107) are connected together instead of providing two adjacent cell-to-control switches 108 which are included in each cell respectively. In addition, the circuit group 120 in FIG. 2 is identical to the circuit group 122 in configuration as a layout, having a configuration wherein signals to be input are signals 105.

Figure 5:
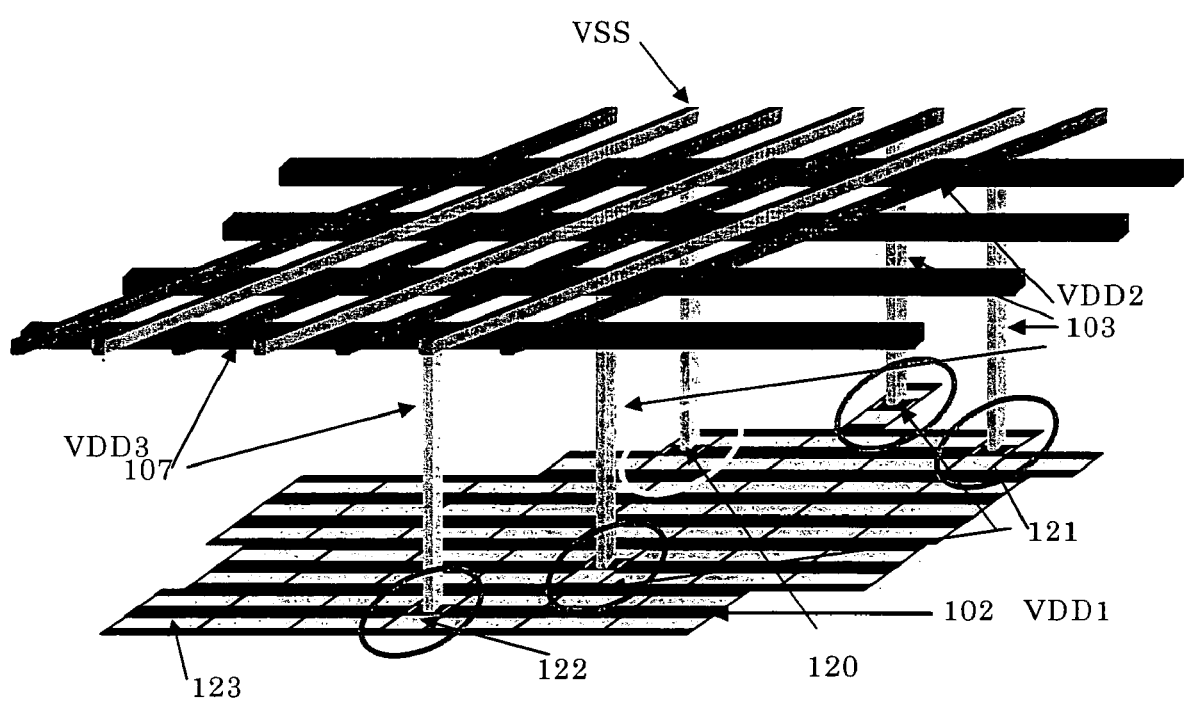
FIG. 5 illustrates a 3-D layout construction of a semiconductor device disclosed in an embodiment of the present invention.

FIG. 5 is a 3-D view illustrating the layout of the circuit in FIG. 4. The layout includes circuit groups 120, circuit groups 121, circuit groups 122, and circuit groups 123 which are comprised of a standard cell. Capacity source lines 103 and control circuit source lines 107 are vertically connected from upper source lines, which correspond to a mesh power supply (power supply wiring configured in grid form), to intracell source lines respectively.

Next, a method for controlling the semiconductor device having the configuration described above will be described below. With the semiconductor device, voltage is not directly supplied to the cell source line which supplies voltage (power supply potential VDD) to the logic circuit 101, but is supplied from the capacity source line 103 and the control circuit source line 107 to the cell source line 102.

In the normal operation mode, when both the cell-to-capacity switch 104 and the cell-to-control switch 108 are in the ON state, the cell source line 102, the capacity source line 103, and the control circuit source line 107 are connected together, exhibiting a power supply potential VDD having the same potential. At this time, the capacity source line 103 and the control circuit source line 107 are supplied with the same power supply potential VDD, and the cell source line 102 is supplied with power supply potential VDD from the capacity source line 103 and the control circuit source line 107.

Next, when transferring to the low power consumption mode 1, the cell-to-capacity switch 104 and the cell-to-control switch 108 change to the OFF state, after which voltage supply to the capacity source line 103 is stopped and both the cell source line 102 (the intracell source line of the standard cell) and the capacity source line 103 fall into the state that power is cut off, their potential dropping to ground potential VSS gradually. Although leakage current flows immediately after the power cutoff, the potential drop of the cell source line 102 check the flow of leakage current. In the interim, the potential of the control circuit source line 107 is maintained at a constant power supply potential VDD, the signals 105 and 109 are sent by the buffer circuits 106 and 110 driven by the control circuit source line 107, respectively, and the state that the cell source line 120 is isolated from the capacity-to-control circuit source lines 103 and 107 can be maintained when the cell-to-capacity switch 104 and the cell-to-control switch 108 are in the OFF state.

Thereafter, when the transition from the low power consumption mode 1 to the normal operation mode is made, the potential of the capacity source line 103 is increased toward power supply potential VDD immediately before the activation of the system. After the potential of the capacity source line 103 has reached a potential V1 demanded (for example, power supply potential VDD), the cell-to-capacity switch 104 is turned on and a voltage is applied to the cell source line 102. Therefore, after the cell source line 102 has been charged to a potential V2 demanded (for example, power supply potential VDD), the cell-to-control switch 108 is turned on.

The potential V1 demanded may be smaller than or equal to power supply potential VDD and it is possible to derive an effect most conveniently by turning on the cell-to-capacity switch 104 in consideration of the timing required for charging the cell source line 102 to power supply potential VDD most quickly. This effect means a fact that the cell source line 102 is charged quickly for quick activation of the system. Also, the potential V2 demanded may be smaller than or equal to power supply potential VDD and it is possible to secure an effect most conveniently by turning on the cell-to-control switch 108 after the cell source line 102 has been charged to the extent that the cell-to-capacity switch 104 does not malfunction by signals from the buffer circuit 106 even if the voltage drop occurs at the control circuit source line 107 by turning the cell-to-control switch 108 on during the charge from the control circuit source line 107 to the cell source line 102. This effect means a fact that the system is started quickly by virtue of another advantage of allowing the charge from the control circuit source line 107 to the cell source line 102.

By adopting the control method above, it is possible to stop the rise of the cell source line 102 until immediately before the activation of the system to suppress leakage current during the transition from a low power consumption mode 1 to the normal operation mode. Also, in order to turn the cell-to-capacity switch 104 on after the capacity source line 103 has been charged, it is possible to perform charging to the capacity source line 103 and the cell source line 102 separately, which leads to less charging to the capacity of the cell source line 102. As a result, it becomes possible to abruptly increase the voltage of the cell source line 102, by which it is possible to reduce the flow-through current which flows through the transistors that make up the logic circuit 101, allowing low power consumption.

In addition, even if there exist a plurality of cell source lines 102, capacity source lines 103 and control circuit source lines 107, and further there exist a plurality of switches 104 and 108 which isolate the cell source lines 102, it is obvious that similar effects can be obtained.

Furthermore, since a low power consumption mode 2 is provided, the transition from the normal operation mode to the low power consumption mode 2 is performed by stopping voltage supply to the capacity source line 103 and the control circuit source line 107. Therefore, voltage supply to the cell source line 102 is stopped as well, and the potentials of the cell source line 102, the capacity source line 103, and the control circuit source line 107 gradually drop to ground potential VSS together. This low power consumption mode 2 is particularly effective in case where the system stops for many hours. The procedure of the transition from the low power consumption mode 2 to the normal mode starts with supplying power supply potential VDD to the control circuit source line 107. By the application of the voltage to the control circuit source line 107, the buffer circuit 110, which drives the cell-to-control switch 108, and the buffer circuit 106, which drives the cell-to-capacity switch 104, are driven to turn off the cell-to-control switch 108 and the cell-to-capacity switch 104. Therefore, the control circuit source line 107 is isolated from the cell source line 102 and the capacity source line 130 is also isolated from the cell source line 102, which leads to the state of the low power consumption mode 1. The transition from the low power consumption mode 1 to the normal operation mode is performed according to the preceding procedure.

In another embodiment of the invention, there are provided signal logic retaining circuits 113 which are driven by the control circuit source line 107 and retain the output signals from the logic circuit 101. The signal logic retaining circuit 113 is comprised of, for example, a flip-flop, so that, in the low power consumption mode 1, low power can be achieved without making the signal logic retained by the flip-flop vanish. Furthermore, in the transition from the low power consumption mode 1 to the normal operation mode, the output signals of the flip-flop retain a constant voltage. Since the voltage of the output of the flip-flop, viz., a starting point which provides the propagation of the data signals, is maintained constant, the propagation of the signals at medium potential at which the largest amount of flow-through current flows through the propagation path of the data signals decreases. Therefore, the probability that the signals at the node of each logic gate are at the medium potential decreases, which leads to the reduction of the flow-through current.

The semiconductor device according to the invention is useful so that it exhibits high-speed performance and low power consumption by making a steep rise in voltage at reclosing after power cutoff while reducing off-leakage current, and by reducing flow-through current.

What is claimed is:
1. A semiconductor device comprising:
logic circuits;
a first source line which supplies voltage to the logic circuits;
a second source line which supplies voltage to the first source line;
a third source line;
first switches by which the first source line is isolated from or connected to the second source line;
second switches by which the first source line is isolated from or connected to the third source line;

first control circuits which are supplied with voltage from the third source line and drive first signals which control the first switches; and second control circuits which are supplied with voltage from the third source line and drive second signals which control the second switches.

2. The semiconductor device of claim 1 comprised of a plurality of cells arranged such that, some of the cells, which form the logic circuits inside, form the first source line through the use of an intracell source line, and the others of the cells, which are the cells forming the first control circuits inside and the cells forming the second control circuits inside, are each provided with an intracell source line connected to the third source line and the second switch at not less than one end of the intracell source line.

3. A semiconductor device of claim 1 having a normal operation mode in which the second source line and the third source line are supplied with a voltage respectively, the first source line is connected to the second source line by the first switch, and the first source line is connected to the third source line by the second switch, and a low power consumption mode in which the first source line is isolated from the second source line by the first switch and the first source line is isolated from the third source line by the second switch, wherein a switch from the normal operation mode to the low power consumption mode is made by a series of steps in which the first source line is isolated from the second source line by the first switch, the first source line is isolated from the third source line by the second switch, and the voltage supply to the second source line is stopped, a switch from the low power consumption mode to the normal operation mode is made by a series of steps in which the voltage supply to the second source line is commenced, the second source line is connected to the first source line by the first switch after the charging of the second source line, and the first source line is connected to the third source line by the second switch after the charging of the first source line.

4. The semiconductor device of claim 3 having a minimum power consumption mode wherein voltage supply to the second and third source lines is stopped, a switch from the normal operation mode to the minimum power consumption mode is made by a step in which voltage supply to the second and third source lines is stopped, a switch from the minimum power consumption mode to the normal operation mode is made by a series of steps in which voltage supply to the third source line is commenced, the first source line is isolated from the second source line by the first switch, and, at the same time, the first source line is isolated from the third source line by the second switch to give the low power consumption mode which changes to the normal operation mode.

5. The semiconductor device of claim 4 which is supplied with a power supply voltage from the third source line and is provided with signal logic retaining circuits which retain the state of signals.

6. A semiconductor device of claim 2 having a normal operation mode in which the second source line and the third source line are supplied with a voltage respectively, the first source line is connected to the second source line by the first switch, and the first source line is connected to the third source line by the second switch, and a low power consumption mode in which the first source line is isolated from the second source line by the first switch and the first source line is isolated from the third source line by the second switch, wherein a switch from the normal operation mode to the low power consumption mode is made by a series of steps in which the first source line is isolated from the second source line by the first switch, the first source line is isolated from the third source line by the second switch, and the voltage supply to the second source line is stopped, a switch from the low power consumption mode to the normal operation mode is made by a series of steps in which the voltage supply to the second source line is commenced, the second source line is connected to the first source line by the first switch after the charging of the second source line, and the first source line is connected to the third source line by the second switch after the charging of the first source line.

7. The semiconductor device of claim 6 having a minimum power consumption mode wherein voltage supply to the second and third source lines is stopped, a switch from the normal operation mode to the minimum power consumption mode is made by a step in which voltage supply to the second and third source lines is stopped, a switch from the minimum power consumption mode to the normal operation mode is made by a series of steps in which voltage supply to the third source line is commenced, the first source line is isolated from the second source line by the first switch, and, at the same time, the first source line is isolated from the third source line by the second switch to give the low power consumption mode which changes to the normal operation mode.

8. The semiconductor device of claim 7 which is supplied with a power supply voltage from the third source line and is provided with signal logic retaining circuits which retain the state of signals.

* * * * *